United States Patent
Udagawa et al.

[19]

[11] Patent Number: 6,114,750
[45] Date of Patent: Sep. 5, 2000

[54] SURFACE MOUNT TO-220 PACKAGE AND PROCESS FOR THE MANUFACTURE THEREOF

[75] Inventors: Hisao Udagawa, Hadano; Hiroshi Kotani, Tsukui-gun, both of Japan

[73] Assignee: International Rectifier Corp., El Segundo, Calif.

[21] Appl. No.: 08/940,230

[22] Filed: Sep. 30, 1997

Related U.S. Application Data

[60] Provisional application No. 60/027,333, Oct. 1, 1996, and provisional application No. 60/029,670, Oct. 30, 1996.

[51] Int. Cl.$^7$ .................................................. H01L 23/495
[52] U.S. Cl. ........................... 257/666; 257/676; 257/787
[58] Field of Search .................................... 257/666, 787, 257/676

[56] References Cited

U.S. PATENT DOCUMENTS

| 4,987,473 | 1/1991 | Johnson . |
| 5,191,403 | 3/1993 | Nakazawa ................................. 257/787 |
| 5,291,059 | 3/1994 | Ishitsuka et al. . |

FOREIGN PATENT DOCUMENTS 0228869  of 1986  European Pat. Off. .

*Primary Examiner*—Roy Potter
*Attorney, Agent, or Firm*—Ostrolenk, Faber, Gerb & Soffen, LLP

[57] ABSTRACT

A surface mount TO-220 package includes leads which are bent within the molded housing and formed prior to molding the housing around the lead frame. A single gauge of frame material is used for both the leads and the main pad area. The bends reduce the height of the package and reduce mechanical stresses in the molded housing.

13 Claims, 4 Drawing Sheets

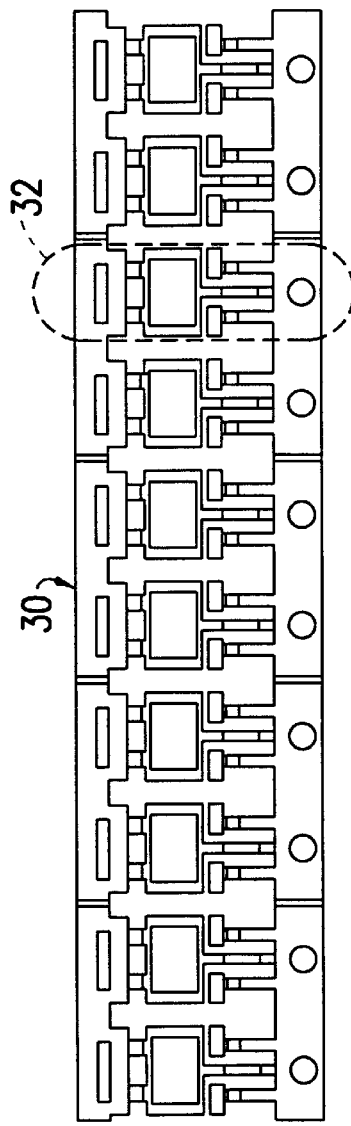
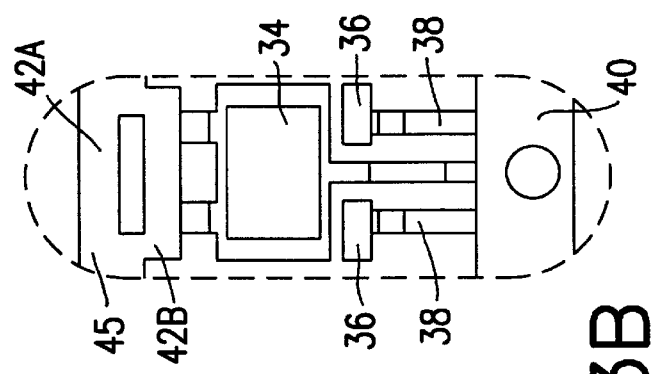
FIG. 3A
FIG. 3B

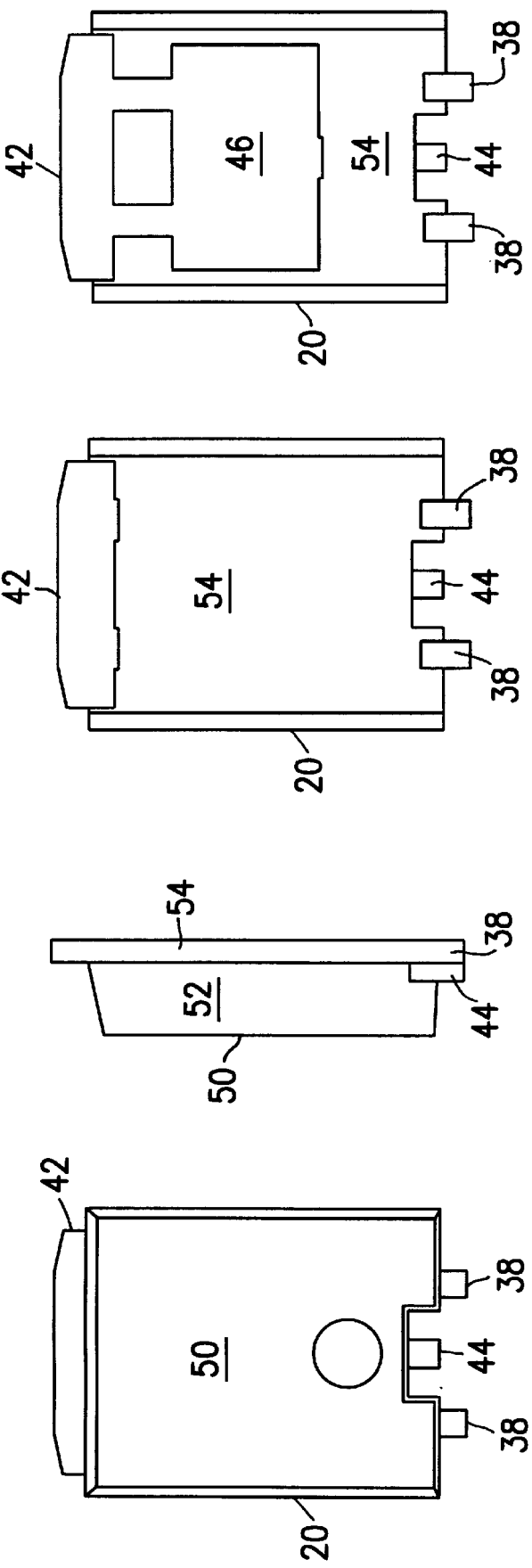

SURFACE MOUNT TO-220 PACKAGE AND PROCESS FOR THE MANUFACTURE THEREOF

This application claims benefit of Provisional Appl. 60/027,333 filed Oct. 1, 1996 and Provisional Appl. 60/029,670 filed Oct. 30, 1996.

FIELD OF INVENTION

The present invention relates to a package for semiconductor devices and, more specifically, to a novel surface mount TO-220 device package.

BACKGROUND OF THE INVENTION

The TO-220 package is a known industry standard. The package includes a thermally conductive base which is preferably metal and on which a semiconductor device is mounted with low thermal impedance between the device and the base. The device may also be electrically connected to the base. The semiconductor device and a portion of the frame are typically encapsulated by a resin material which protects the device from its environment. A locking projection typically extends from the base to the outside of the protective epoxy and is fastened to the external mounting surface to draw heat from the device. Also included are lead terminals which extend outside the resin body and include bonding pads to which a wire bond connection is provided from the device to the leads.

In a surface mount device, the surface of the base that is adjacent to the circuit board and opposite from the device is exposed for electrical contact to the circuit board.

Typically, the leads are bent outside the resin body to contact the surface and provide electrical connection to the circuit board. This bend in the leads, however, can cause mechanical stresses in the resin body.

Moreover, two gauges of metal are typically used. A thick gauge metal is used for the base, and a thin gauge metal is used for the leads so that they may be bent. This use of two gauges increases the complexity of the manufacture of the package device.

SUMMARY OF THE INVENTION

The present invention provides for a surface mount TO-220 package in which the leads are bent prior to molding the resin body around the device and frame to minimize the mechanical stress on the leads. Also, a single gauge of lead frame material is used for both the leads and the main pad area, which minimizes material costs and reduces the height of the package body. The length of the leads outside of the package is also shortened. Though the combined length of the leads inside and outside the package is increased, the built-in resistance and inductance of the package is substantially reduced because the thickness of the leads is the same as that of the main pad area. The lead frame configuration also improves assembly yield. The package is suitable to be a drop-in replacement for existing surface mount design TO-220 type packages but can accept larger die sizes than existing size 4 die.

BRIEF DESCRIPTION OF THE DRAWINGS

The invention will now be described in greater detail in the following detailed description with reference to the drawings in which:

FIG. 3A is a top view of a strip of lead frames and their supports which are used in the manufacture of the present invention;

FIG. 3B is an enlarged view of one of the lead frames and its supports;

FIGS. 5A–5E are top, end, side and bottom views, respectively, of a package body according to the present invention.

DETAILED DESCRIPTION OF THE INVENTION

Figure 1:
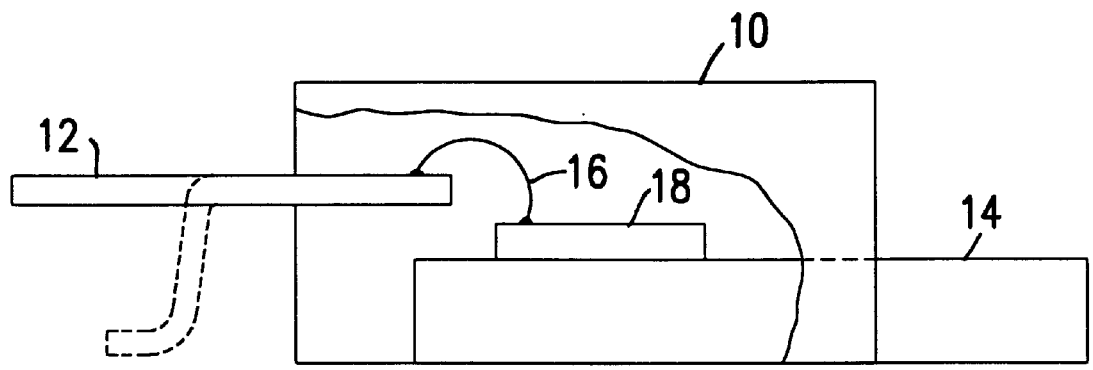
FIG. 1 shows a partial cutaway side view of a known surface mounted TO-220 package.

Referring first to FIG. 1, there is shown a conventional surface mounted TO-220 device package 10, illustrated in a cutaway side view. A surface of semiconductor device 18 is attached to a metal plate 14. The plate 14 provides thermal contact with the device 18 but may also be electrically connected to the device. An opposing surface of the device 18 is connected to one or more lead terminals 12 by wire bonds 16. The device 18 and a portion of lead terminal 12 and plate 14 are encapsulated in a package body, typically of resin.

To provide for contact with the mounting surface, the lead terminals 12 are bent downward, as shown by the dashed lines extending from lead terminal 12, after the package body is molded around the frame. The process of bending after molding causes mechanical stresses in the package body.

The plate 14 also has a greater thickness than the lead terminal 12 so that the frame must be fabricated of two gauges of metal.

Figure 2:
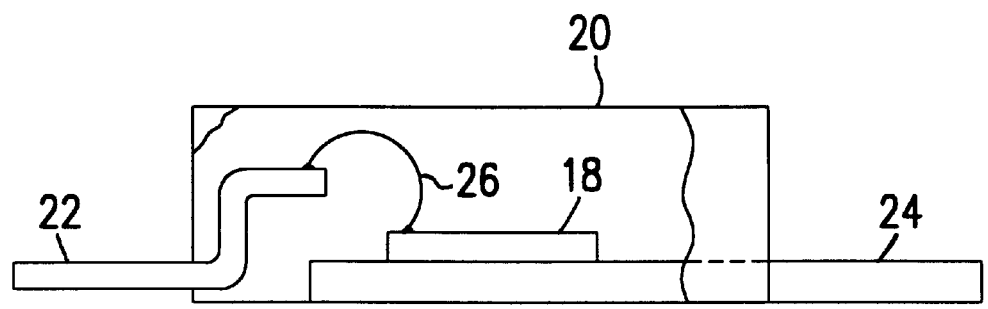
FIG. 2 shows a partial cutaway side view of a surface mounted package according to an embodiment of the present invention.

FIG. 2 illustrates a surface mounted TO-220 device package 20 according to an embodiment of the invention. Here, lead terminal 22 is bent prior to molding the package body around the frame and is located inside the package body to minimize mechanical stresses on the package body. Moreover, the lead terminal 22 is of the same thickness as plate 24 so that the package may be formed of frame material of a single gauge which reduces the built-in resistances and inductances in the package. The height of the package 20 is significantly reduced when compared to the known package 10. Furthermore, though a longer length of the lead terminal 22 may be used, the length of the portion of lead terminal 22 that extends outside the package 20 is reduced.

FIG. 3A shows a strip 30 of multiple device frames 32 with their connecting supports, one of which is shown in greater detail in FIG. 3B. The frame includes a main pad area 34 to which a device is electrically and thermally attached. The main pad area 34 is connected to a plate 42 which has a lower portion 42A which forms a surface contact with pad area 34 to the mounting surface and has an upper portion 42B which provides support for the frame and is subsequently removed after molding. The plate 42 is connected to an adjoining frame by support 45.

Also provided are bonding pads 36 which are connected by lead terminals 38 to a plate 40 which serves as a second contact to the mounting surface. A hole is provided in plate 40 so that each respective device formed of strip 30 can be indexed by the die bonding and wire bonding equipment, such as by inserting and turning the spokes of a sprocket to advance the strip. A temporary support 44 (shown in FIG. 4B) connects pad area 34 to plate 40 during the molding of the device but is subsequently removed after molding.

Figures 4A, 4B:
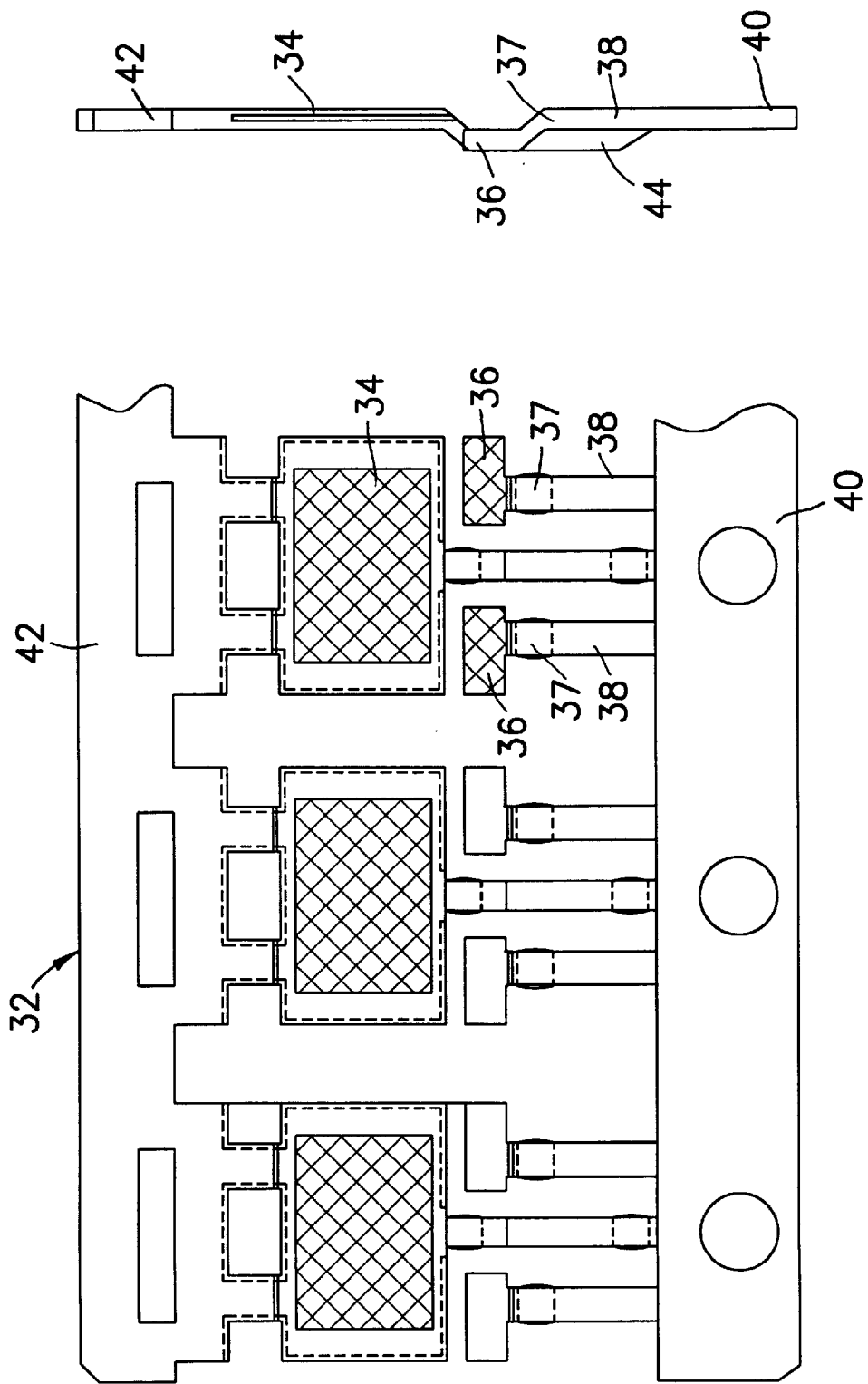
FIG. 4A is an enlarged view showing several of the lead frames and supports shown in FIG. 3A in greater detail.
FIG. 4B is a side view of the strip shown in FIG. 4A.

FIG. 4A shows in greater detail three of the frames and supports shown in FIG. 3A. In accordance with the invention, the bonding pad 36 is raised above the surface of plate 40 and pad area 34. The bonding pad area 36 is connected to lead terminal 38 by a bent portion 37. Also shown in FIG. 4B is temporary support strip 44 which is also raised above pad area 34 and plate 40 by a pair of bent portions 44A and 44B which, as noted above, are removed after molding.

The process for fabricating the device package according to the invention includes the following steps:

A semiconductor device (not shown) is attached to pad area 34 using methods known in the art, such as using an electrically conductive die attach compound. The bonding pad areas located on an opposing surface of the device are wire bonded to pad areas 36 using known wire bonding methods, such as ultrasonic wire bonding. Alternatively, the bonding pad areas opposing the surface of the die are solder connected to pad area 36 to further reduce the built-in resistance. The main pad area 34, bonding pad areas 36, and the semiconductor device are then encapsulated within a molded housing, typically formed of resin of other transfer mold compounds. This is also performed using methods known in the art. The temporary support portion 44 and the top portion of plate 42 are then removed.

The interconnecting portions located between the respective device frames are then cut away to attain respective device packages such as is shown in FIG. 5A. Here, the device package 20 is shown after molding and a vestigial portion of plate 42 protrudes outside housing 20 as well as a portion of temporary connecting lead 44. Leads 38 also protrude from the device and connect to plate 40, which is not shown.

FIG. 5B illustrates an end view of the completed package showing the lead 38 flush with the bottom surface of the package. FIG. 5C shows a side view of device 20 which similarly shows the leads 38 flush with the bottom surface of the package.

FIG. 5D shows a bottom view of package 20 which depicts the exposed surface of plate 42 and its connected pad area 46. At one end of the package, leads 38 protrude at one end. At the opposite end leads 38 bend and are concealed within the package housing.

FIG. 5E illustrates a bottom view of the device according to an alternative embodiment in which a pad area 46 is also raised above the surface of plate 42 and is encapsulated within the body housing.

The device shown in FIGS. 5A–5E may then be soldered to the printed circuit board, or to any other known electrically and thermally conductive material, using conventional mass production soldering techniques.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A conductive lead frame for supporting a semiconductor device encapsulated by a molded housing, said lead frame comprising:

a main pad area which supports said semiconductor device and has an extending portion extending from an edge thereof that extends beyond a boundary of said molded housing; and at least one pin coupled to said semiconductor device each having a lead terminal portion extending beyond said boundary of said molded housing, each of said at least one pin further having a bonding pad area;

said at least one pin each having the same thickness as said main pad area and having a bend located within said boundary of said molded housing such that said bonding pad area is raised above said main pad area and said lead terminal portion extending beyond said boundary is at a common height with said main pad area; and wherein said main pad area is effective to function as a heat sink and extends outside said boundary of said molded housing.

2. The lead frame of claim 1 wherein said main pad area includes a support strip which extends from an opposing edge of said main pad area and extends beyond said boundary of said molded housing.

3. The lead frame of claim 2 wherein:

said lead frame includes at least two pins; and said support strip is located between two of said pins.

4. The lead frame of claim 2 wherein said support strip includes at least one bend located within said boundary of said molded housing.

5. The lead frame of claim 4 wherein said support strip includes another bend.

6. A conductive lead frame for supporting a semiconductor device encapsulated by a molded housing, said lead frame comprising:

a main pad area which supports said semiconductor device and has an extending portion extending from an edge thereof that extends beyond a boundary of said molded housing; and at least one pin coupled to said semiconductor device each having a lead terminal portion extending beyond said boundary of said molded housing, each of said at least one pin further having a bonding pad area;

said at least one pin each having the same thickness as said main pad area and having a bend located within said boundary of said molded housing such that said bonding pad area is raised above said main pad area and said lead terminal portion extending beyond said boundary is at a common height with said main pad area; and wherein said extending portion of said main pad area includes a lower part located at said edge and an upper part that extends beyond said boundary of said molded housing.

7. A semiconductor device package for housing a semiconductor device, said package comprising:

a main pad area which supports said semiconductor device;

a molded housing which encloses said main pad area and said semiconductor device;

said main pad area including an extending portion extending from an edge thereof that extends beyond a boundary of said molded housing;

at least one pin coupled to said semiconductor device having a lead terminal portion extending beyond said boundary of said molded housing, each of said at least one pin including a bonding pad area;

said at least one pin each having the same thickness as said main pad area and having a bend located within said boundary of said molded housing such that said bonding pad area is raised above said main pad area and said lead terminal portion extending beyond said boundary is at a common height with said main pad area; and wherein said main pad area is effective to function as a heat sink and extends outside said boundary of said molded housing.

8. A semiconductor device package for housing a semiconductor device, said package comprising:

a main pad area which supports said semiconductor device;

a molded housing which encloses said main pad area and said semiconductor device;

said main pad area including an extending portion extending from an edge thereof that extends beyond a boundary of said molded housing;

at least one pin coupled to said semiconductor device having a lead terminal portion extending beyond said boundary of said molded housing, each of said at least one pin including a bonding pad area;

said at least one pin each having the same thickness as said main pad area and having a bend located within said boundary of said molded housing such that said bonding pad area is raised above said main pad area and said lead terminal portion extending beyond said boundary is at a common height with said main pad area; and wherein said main pad area includes a support strip which extends from said opposing edge of said main pad area and extends beyond said boundary of said molded housing.

9. The package of claim 8 wherein:

said package further includes at least two pins; and said support strip is located between two of said pins.

10. The package of claim 8 wherein said support strip includes at least one bend located within said boundary of said molded housing.

11. The package of claim 10 wherein said support strip includes another bend.

12. A semiconductor device package for housing a semiconductor device, said package comprising:

a main pad area which supports said semiconductor device;

a molded housing which encloses said main pad area and said semiconductor device;

said main pad area including an extending portion extending from an edge thereof that extends beyond a boundary of said molded housing;

at least one pin coupled to said semiconductor device having a lead terminal portion extending beyond said boundary of said molded housing, each of said at least one pin including a bonding pad area;

said at least one pin each having the same thickness as said main pad area and having a bend located within said boundary of said molded housing such that said bonding pad area is raised above said main pad area and said lead terminal portion extending beyond said boundary is at a common height with said main pad area; and wherein said extending portion of said main pad area includes a lower part located at said edge and an upper part that extends beyond said boundary of said molded housing.

13. A semiconductor device package comprising:

a semiconductor die;

a plastic housing for enclosing said die;

a lead frame comprising a pad embedded in said plastic housing and having a flat bottom surface exposed for connection at a bottom of said housing and a top surface which receives said die;

a lead terminal having a first portion embedded within said housing and connected to an electrode on said die, said lead terminal further having a second portion continuous with said first portion, extending beyond a periphery of said housing and extending exteriorly to said housing; wherein said first portion is pre-bent before encapsulation by said plastic housing whereby said first and second portions lie in spaced parallel planes; and said second portion comprises a straight, unbent section which is coplanar with said flat bottom surface.

* * * * *